(12) United States Patent
Thakar et al.

(10) Patent No.: US 6,803,661 B2
(45) Date of Patent: Oct. 12, 2004

(54) POLYSILICON PROCESSING USING AN ANTI-REFLECTIVE DUAL LAYER HARDMASK FOR 193 NM LITHOGRAPHY

(75) Inventors: Gautam V. Thakar, Plano, TX (US); Reima T. Laaksonen, Dallas, TX (US); Cameron Gross, Allen, TX (US); Eric A. Joseph, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/645,032

(22) Filed: Aug. 21, 2003

(65) Prior Publication Data

US 2004/0092089 A1 May 13, 2004

(Under 37 CFR 1.47)

Related U.S. Application Data

(62) Division of application No. 09/939,259, filed on Aug. 24, 2001, now Pat. No. 6,624,068.

(51) Int. Cl.[7] .................. H01L 23/48; H01L 23/52; H01L 29/40
(52) U.S. Cl. .................. 257/758; 257/759; 257/760
(58) Field of Search .................. 257/758, 759, 257/753, 760, 774, 295, 296, 768, 510, 534

(56) References Cited

U.S. PATENT DOCUMENTS

| | | | | |
|---|---|---|---|---|
| 6,013,582 A | * | 1/2000 | Ionov et al. | 257/E21.314 |
| 6,537,918 B2 | * | 3/2003 | Ionov et al. | 257/E21.252 |
| 6,720,256 B1 | * | 4/2004 | Wu et al. | 438/638 |

* cited by examiner

*Primary Examiner*—John F. Niebling
*Assistant Examiner*—Walter L. Lindsay, Jr.
(74) *Attorney, Agent, or Firm*—W. James Brady, III; Frederick J. Telecky, Jr.

(57) ABSTRACT

A lithographic method of forming submicron polysilicon features on a semiconductor substrate, including the steps of coating said substrate with an anti-reflective coating (ARC) comprising two layers having matched indices of refraction (n) and extinction coefficient (k) selected to reduce reflection to less than 1% with 193 nm wavelength exposure. The ARC is subsequently patterned to serve as an etch hardmask. Preferably the ARC mask consists of a first layer of between 300 and 1500 angstroms of silicon rich silicon nitride having an extinction coefficient of from 0.77 to 1.07, and a second layer of between 170 and 320 angstroms of silicon oxynitride having an extinction coefficient of about 0.32.

3 Claims, 2 Drawing Sheets

POLYSILICON PROCESSING USING AN ANTI-REFLECTIVE DUAL LAYER HARDMASK FOR 193 NM LITHOGRAPHY

This application is a Division of Ser. No. 09/939,259 filed Aug. 24, 2001, now U.S. Pat. No. 6,624,068.

FILED OF THE INVENTION

The invention relates generally to the manufacture of semiconductor devices, and more specifically to the method for defining precise, narrow polysilicon features.

BACKGROUND OF THE INVENTION

The semiconductor industries continuing drive toward integrated circuits whose geometric features are decreasing has in turn led to the need for photolithographic techniques using shorter wavelengths in the mid and deep ultraviolet (DUV) spectrum to achieve fine features. In the process of defining very fine patterns, optical effects are often experienced which lead to distortion of images in the photoresist that are directly responsible for line width variations, and which in turn can compromise device performance.

Many of the optical effects can be attributed to reflectivity of the underlying layers of materials, such as polysilicon and metals, which can produce spatial variations in the radiation intensity in the photoresist, and in turn result in non-uniform line width development. Radiation can also scatter from the substrate and photoresist interfaces into areas where exposure is not intended, again resulting in line width variation.

As the wavelength of exposure sources is shortened to bring improved resolution by minimizing diffraction limitations, the difficulty in controlling reflections is increased. In an attempt to circumvent the reflection problems, a number of antireflective coatings (ARC) to be interposed between the substrate and photoresist have been developed, largely for specific applications, and with varying shortcomings.

To further complicate the problem, photoresists for short wavelength exposure sources to deep ultraviolet (DUV) light are necessarily very thin, and either do not withstand, or are undercut during the etch process resulting in further deterioration of the line resolution. Clean-up and removal of both the resist, and the antireflective coating can present additional problems in the manufacturing process of sub-micron features.

As lithography moves to the 193 nm (nanometer) wavelength of an ArF excimer laser light, a need exists for a method to form sub-micron integrated circuit patterns which overlay varying topography, and often highly reflective substrate materials. In particular, defining precise, sub-micron features in relatively thick doped and undoped polysilicon over gate oxide presents a significant challenge to the industry. An inorganic antireflective coating of silicon oxynitride (SixOyNz) has been used in the industry, and while it has advantages, its selectivity to oxide, and slow removal rate with phosphoric acid post etch clean-up has an adverse effect on the polysilicon line definition, and may result in damage to active areas. Alternately, a bilayer of silicon oxynitride over doped silicon oxide has been proposed. However, the optical properties of the oxide have a narrow process window, an undesirable feature for volume manufacturing, and further the process is complicated by the requirement for a special tool for removal.

Therefore, an anti-reflective coating for deep uv exposure in the 193 nm wavelength region which is compatible with polysilicon etch and clean-up processes, and which supports volume manufacturing requirements of sub-micron polysilicon features is clearly needed by the industry.

SUMMARY OF THE INVENTION

It is an objective of the present invention to provide a method for accurately defining sub-micron polysilicon features on a semiconductor device using 193 nm wavelength lithography.

It is further an object of this invention to provide an dual layer coating which serves both as an in situ etch mask, and as a low reflectivity coating for deep UV exposure.

It is an object of the invention to provide an inorganic coating having reflectivity of less than 1% at 193 nm wavelength exposure.

It is an object of the invention to provide a method for improved lithographic depth of focus as a result of compatibility with thin photoresist and antireflective properties of the ARC.

It is an object of this invention to provide a low reflectivity hard mask for polysilicon processing having a large film thickness window.

It is an object of the invention to provide a coating comprising multiple layers wherein the thickness, the extinction coefficient and index of refraction are matched to predict, and minimize reflectivity.

It is an object of this invention to provide a hard mask which is compatible with phosphoric acid post polysilicon etch clean-up without deterioration of underlying oxide and/or active areas.

These and other objectives will be met by sandwiching between the polysilicon and photoresist layers, an ARC (anti-reflective coating) bilayer wherein the materials have matched index of refraction (n) and extinction coefficient (k) specifically to minimize reflection to less than 1% with 193 nm wavelength exposure, and which is subsequently patterned to serve as an etch hard mask. Preferably the ARC mask consists of a bottom layer of greater than 300 angstroms, and less than 1500 angstroms of silicon rich silicon nitride having an extinction coefficient of from 0.77 to 1.07, and a top layer of about 250 angstroms of silicon oxynitride having an extinction coefficient of about 0.32. The silicon nitride is in direct contact with a polysilicon layer overlying a gate oxide, or other dielectric layer. An etch hard mask is formed from the ARC bilayer by etching in selected areas unprotected by photoresist. The resist is removed by plasma ashing, and the exposed polysilicon etched along with the silicon oxynitride layer, leaving only the silicon nitride to be removed by a phosphoric acid post polysilicon etch clean-up, which does not damage active moat and gate areas.

These and other features and advantages of the present invention will become apparent from the following description which is to be read in connection with the accompanying drawings.

DETAILED DESCRIPTION OF THE DRAWINGS

According to the invention, a method is provided for fabricating a semiconductor device having narrow, sharply defined polysilicon features by using deep UV exposure, such as 193 nanometers (nm). The invention includes a patterned bilayer of inorganic materials sandwiched between the polysilicon and photoresist layers, serving both as an antireflective coating having highly selective optical properties, and as a hard mask, stable during the etch and clean-up processes.

Figure 1:
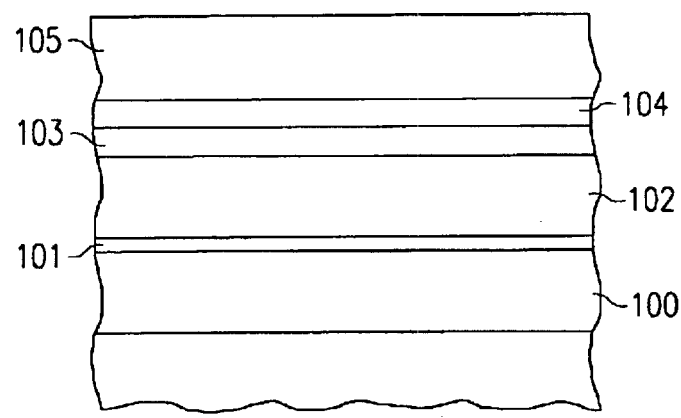
FIG. 1 provides a cross sectional view showing the layers of material for fabricating a semiconductor device using the inorganic ARC and hard mask of this invention.

FIG. 1 is a cross-section of the layers involved in processing polysilicon structures of a semiconductor device using the inorganic antireflective coating (ARC), and hard mask of the invention.

A very thin oxide or other dielectric layer 101 exists between the provided silicon substrate 100, and a deposited polysilicon layer 102 in the range of about 1200 to 2500 angstroms (A) thickness.

A dual antireflective thin film layer of materials, in the preferred embodiment includes silicon oxynitride 104 and silicon rich silicon nitride 103 deposited between the polysilicon 102, and a thin layer of photoresist 105. The photoresist, in the range of 2000 to 3000 angstroms in thickness is preferably a positive acting deep UV resist, such as PAR 707 or 710 from Sumitomo Chemicals.

A unique feature of the invention is the inorganic bilayer having specific antireflective properties which improve depth of focus of the lithographic process, have a large process window, and form a hard mask which is able to withstand the etch process without deterioration of either the polysilicon line width, or the underlying oxide, moat, or other active areas.

Silicon oxynitride (SixOyNz) has been demonstrated as an antireflective coating for deep UV resist exposures 1a largely because of the low index of refraction or "n" value. Such films have been manufactured having index of refraction in the range of 1.8 to 1.9, and having extinction coefficients or "k" values which can be varied from 0.32 to 0.86. However, the removal of these materials is difficult without resulting in damage to the moat and the gate line width, thus making the single SixOyNz film unsatisfactory for manufacturing semiconductor devices.

Alternately, silicon rich silicon nitride (SixNy) films have been used as antireflective coatings and/or as hard masks, however their optical constants in the 193 nm wavelength range are not acceptable. Films having high "k" values, in the range of 0.7 to 1.1, and low "n" values in the range of 2.1 to 2.3 have high reflectivity. On the other hand, SixNy films having low "k" values, in the range of 0.2 to 0.5, and high "n" values in the range of 2.35 to 2.45 provide low reflectivity at 500–550 angstroms thickness, but the film thickness process window is very small, and the film is not thick enough to permit etching thick polysilicon of about 2200 to 2500 A thickness.

Simulations show that in order to provide a coating with less than 1% reflection, the ARC in contact with the resist must have rather precise "n" and "k" values, and that such values can be achieved by matching the properties of a bilayer of materials.

A film having a low extinction coefficient of about 0.3, for the upper layer, or that layer in contact with the photoresist, and a thickness of about 250 angstroms allows use of a material having a large extinction coefficient of about 1 for the bottom layer. The reflectivity is largely independent of the thickness of the lower layer, provided that it is greater than 300 angstroms, and the "k" value is in the range of 0.77 to 1.07. Thickness the lower layer is allowed between 300 and 1500 angstroms in order to be compatible with gate pattern and etch processes.

A second or upper layer of SixOyNz 104 in the range of 170 to 230 angstroms with an extinction coefficient of 0.32 paired with a first, or bottom layer of SixNy 103, greater than 300 angstroms thick, and having an extinction coefficient of about 1.02 was shown to provide an anti-reflective coating having less than 1% reflectivity. This combination of non-stiochiometric plasma deposited films, SixOyNz 104 and SixNy 103, is compatible with deposition and etching processes, and with lithographic requirements for 193 nm exposure, and therefore is the preferred embodiment of the hard mask ARC for defining submicron polysilicon features.

Alternate material selections having the necessary "n" and "k" values are acceptable as ARC coatings for 193 nm wavelength exposure, provided that the masking functions and removal process are compatible with manufacturing technology.

FIGS. 1 through 5a and 5b illustrate, in cross section, process steps in accordance with an embodiment of the invention wherein submicron polysilicon structures of an integrated circuit device are fabricated using 193 nm wavelength exposure. FIG. 1 illustrates the unpatterned or etched multiple layers of the structure including, a polysilicon layer 102 in the range of 1600 to 2500 angstroms thickness overlying a thin silicon oxide film. These layers are deposited or grown by known manufacturing processes.

The anti-reflective coating films 103 and 104 are deposited in a parallel plate PECVD (plasma enhanced chemical vapor deposition) reactor, such as a Centura Mainframe, DxZ process chamber as supplied by Applied Materials. The deposition processes for the bilayer ARC materials 103/104 using the exemplary reactor includes a process temperature of 350 deg. C., pressure of 6.2 Torr, and an RF power of 130 Watts for SixNy 103, and RF power of 120 Watts for SixOyNz 104. For the silicon rich silicon nitride 103 deposition, $SiH_4$ is introduced at 88 sccm, $NH_3$ at 225 sccm and He at 1900 sccm. Following the silicon nitride 103 deposition, a silicon oxynitride 104 is formed in the same chamber by introducing $SiH_4$ at 63 sccm, $N_2O$ at 187 sccm, and He at 1900 sccm. The latter film 104 incorporates a high concentration of hydrogen, in the range of 20–30 atomic percent, in the film. The preferred deposition process parameters, developed to provide the required "n" and "k" values may vary with the specific chamber and reactor design.

A photoresist 105, preferably a positive acting resist, such as PAR-707 or PAR-710 as supplied by Sumitomo Chemicals is deposited atop the antireflective SixOyNz layer using conventional spin coating techniques. The very thin photoresist 105, of approximately 2100 to 3000 angstroms thickness, is kept thin in order to improve depth of focus for the deep UV exposure, as well as to allow easy of resist removal.

In accordance with the invention unwanted reflection of radiation from underlying polysilicon during lithographic processes is alleviated by use of the specific combined anti-reflective properties of films of SixOyNz 103 and SixNy 104. Simulations were used to predict the antireflective properties, and materials experimentally synthesized to verify the predictions.

Figure 2:
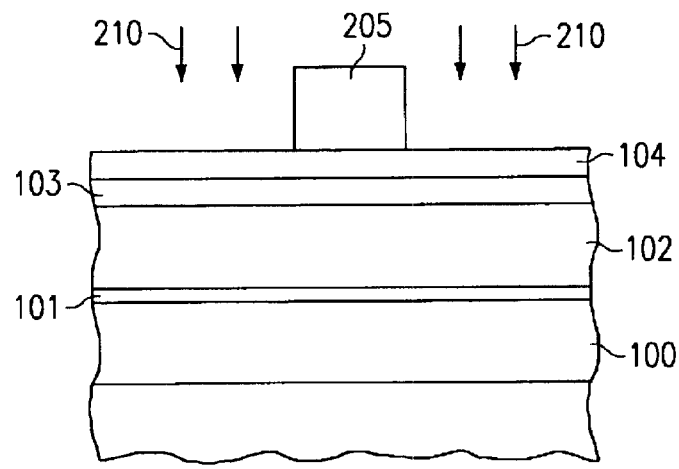
FIG. 2 is a cross-sectional view of the semiconductor device of FIG. 1 showing the resist layer patterned in accordance with the present invention.
Figure 3:
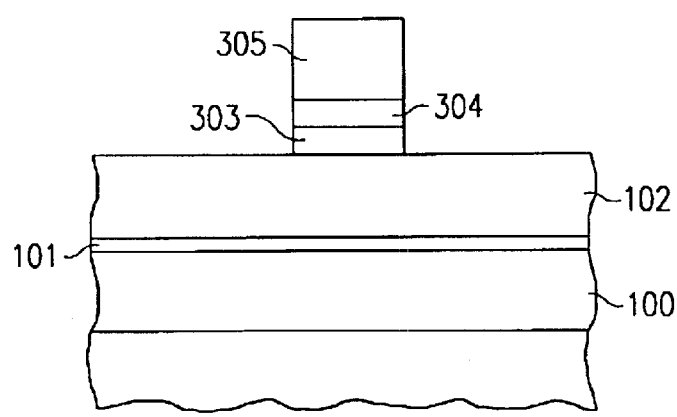
FIG. 3 is a cross-sectional view of the semiconductor device of FIG. 1 showing the photoresist mask and patterned ARC in accordance with the present invention.

In FIG. 2, the photoresist 205, is lithographically patterned in selected areas using 193 nm wavelength exposure 210 from for example, an ArF excimer laser source. After developing, the resulting well defined photoresist pattern 205, as shown in FIG. 2, forms a resist mask which outlines features subsequently to be etched into an inorganic hard mask of SixOyNz 304 and SixNy 303, as shown in FIG. 3.

Etch and overetch of the hard mask layers is accomplished in a commercially available plasma etch reactor using $CF_4$ and $O_2$.

Figure 4:
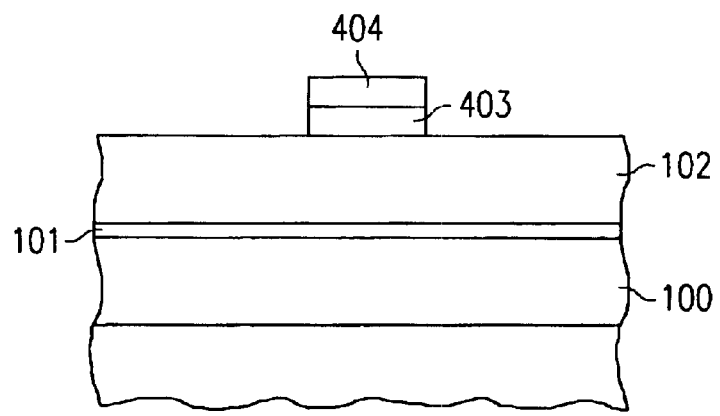
FIG. 4 is cross-sectional view of the semiconductor device of FIG. 1 with the hard mask of the current invention.

Following etch of the SixOyNz 304 and SixNy 303, the photoresist 305 is removed by an oxygen ash step, which may be accomplished in the same reactor. In the exemplary process, the photoresist is rapidly removed by an ash process using an $O_2$ flow rate of 100 sccm and $N_2$ flow of 200 sccm at 10 mTorr. The resulting hard mask 403/404 structure is illustrated in FIG. 4.

Figure 5A:
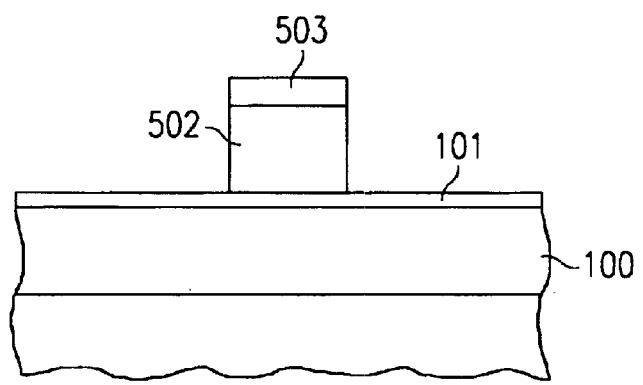
FIG. 5a is a cross-sectional view of the semiconductor device of FIG. 1 with the patterned silicon rich silicon nitride and polysilicon.

Using the inorganic hard mask, well defined sub-micron polysilicon structures are formed by plasma etching the unprotected areas. The SixOyNz 404 portion of the hard mask is removed along with the unprotected polysilicon during the etch process, leaving only the SixNy as the final mask. The resulting structure including the polysilicon structure 502 and SixNy 503 is illustrated in FIG. 5*a*.

Polysilicon etch is accomplished in a commercially available plasma etch equipment using an etchant such as $CF_4$. The specific etch process parameters are equipment, and polysilicon thickness dependent.

Figure 5B:
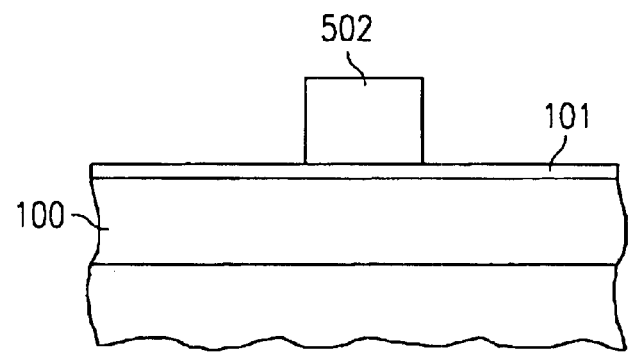
FIG. 5b is a cross-sectional view of the semiconductor device of FIG. 1 with the completed polysilicon feature.

Fabrication of the polysilicon feature is completed by removing the silicon rich silicon nitride 503 using conventional hot phosphoric acid post polysilicon etch clean-up processing. The completed polysilicon feature 502 is illustrated in FIG. 5*b*. The rapid removal rate, 100 Angstroms per minute, of silicon nitride by phosphoric acid supports a highly manufacturable process, and minimizes damage to underlying active areas on the device.

The invention has been described with reference to specific embodiments, however, it is not intended to be limited to the illustrated embodiments, but rather it is intended to cover modifications and variations that can be made without departing from the spirit of the invention.

The method for fabrication of sub-micron polysilicon features has been described using a specific bilayer anti-reflective coating, which subsequently serves as an etch mask. However, different combinations of materials and processes can be used as long as the combined "n" and "k" values are developed for a thin photoresist necessary with DUV exposure, and the processes are compatible with manufacturing tolerances for deposition, etch, and clean-up. An alternate bilayer ARC coating is a silicon nitride over silicon nitride bilayer, wherein the deposition parameters are tailored to provide the necessary "n" and "k" values. Computer simulations followed by fabrication and measurement of test structures is the preferred approach for such development. Further, the polysilicon structures, oxide layers, and photoresist types can be varied according to manufacturing preferences.

What is claimed is:

1. An anti-reflective coating comprising a bilayer of silicon rich silicon nitride in the range of 300 to 1500 angstroms thickness, and a layer of silicon oxynitride in the range of 170 to 330 angstroms thickness.

2. An antireflective coating as in claim 1 wherein the extinction coefficient of the silicon nitride layer is in the range of 0.77 to 1.07, and the silicon oxynitride extinction coefficient is in the range of 0.3 to 0.4.

3. An antireflective coating as in claim 1 wherein reflectivity is less than 1% at 193 nm wavelength exposure.

* * * * *